United States Patent [19]

Greubel et al.

[11] 4,264,124

[45] Apr. 28, 1981

[54] DEVICE FOR COLLECTING LIGHT AND METHOD OF MANUFACTURING SUCH DEVICE

[75] Inventors: Waldemar Greubel; Ferdinand Quella, both of Munich, Fed. Rep. of Germany

[73] Assignee: Siemens Aktiengesellschaft, Berlin & Munich, Fed. Rep. of Germany

[21] Appl. No.: 62,816

[22] Filed: Aug. 1, 1979

[30] Foreign Application Priority Data

Aug. 2, 1978 [DE] Fed. Rep. of Germany ....... 2833914

[51] Int. Cl.³ .................... H01L 31/00; G02B 5/14
[52] U.S. Cl. .................... 350/96.10; 136/247
[58] Field of Search ............. 350/96.10; 250/227; 252/301.35, 301.36; 136/247, 248, 256

[56] References Cited

FOREIGN PATENT DOCUMENTS

| 2554226 | 8/1977 | Fed. Rep. of Germany . |
| 2620115 | 10/1977 | Fed. Rep. of Germany . |
| 2742899 | 10/1978 | Fed. Rep. of Germany . |
| 2724748 | 12/1978 | Fed. Rep. of Germany . |

OTHER PUBLICATIONS

Von E. Lippert, Z für Elektrochem. Ber. Bunsens Ges Phys. Chem. vol. 61, pp. 962–975, 1957.
Windsor, Binary and Multicomponent Solutions of Amphiphillic Compounds Chemical Reviews, vol. 60, No. 1, 1968 pp. 1–39.
Mauer et al., Fluorescent Collector for Solar Energy Collection, Research Disclosure, No. 129, 1975.
Goetzberger et al., Solar Energy, Conversion with Fluorescent Collectors, 1977, pp. 123–129.
Greubel, Das Fluoreszenz–Aktivierte Display, Electronik vol. 6, 1977, pp. 55–56.
Keil, Design Principles of Flourescence Radiation Converters Nuclear Instruments and Methods, vol. 87, pp. 111–123, 1970.

Primary Examiner—John K. Corbin
Assistant Examiner—Rodney B. Bovernick
Attorney, Agent, or Firm—Hill, Van Santen, Steadman, Chiara & Simpson

[57] ABSTRACT

A light-collecting device in the form of, for example, a rectangularly-shaped body having a so-called "fluorescent plate" with at least one light-exit window is comprised of a solid polymerized synthetic carrier material, such as a polyacrylate, a polymethacrylate, a polystyrene or copolymers thereof, containing fluorescing particles therein which have finite dipole moments with different values in the basic and in the excited state and containing a polar organic additive, such as a high-boiling polar solvent, for example, an aliphatic or aromatic alcohol, a nitrile or an ionogenic or non-ionogenic soap, with the fluorescing particles and additive being substantially uniformly distributed throughout such carrier material. The additive creates an environment with an orientating polarization about the fluorescent particles whereby the environment can re-orientate so-quickly that it achieves its thermodynamic equilibrium substantially completely during the existence of the excited state in the fluorescing particles and tends to suppress the disruptive self-absorption of light within the fluorescent plate. Such self-absorption originates from a partial overlap of the emission spectrum with the absorption spectrum of the fluorescing particles. The additive can be dissolved in the synthetic carrier material or can be chemically linked therewith and the so-attained system can be injection moulded, extruded or cast into a desired body form. The disclosed device is useful as a solar collector, an optical indicia transmitter or an image brightener for passive displays.

43 Claims, 3 Drawing Figures

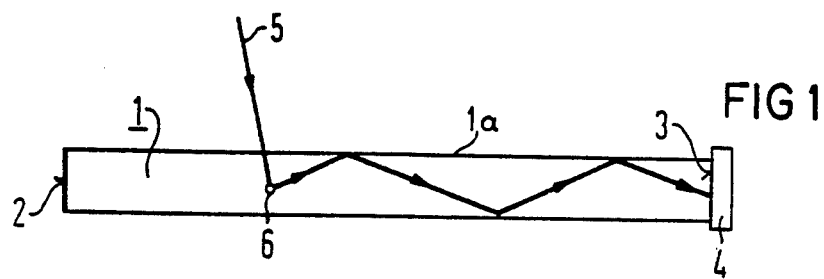
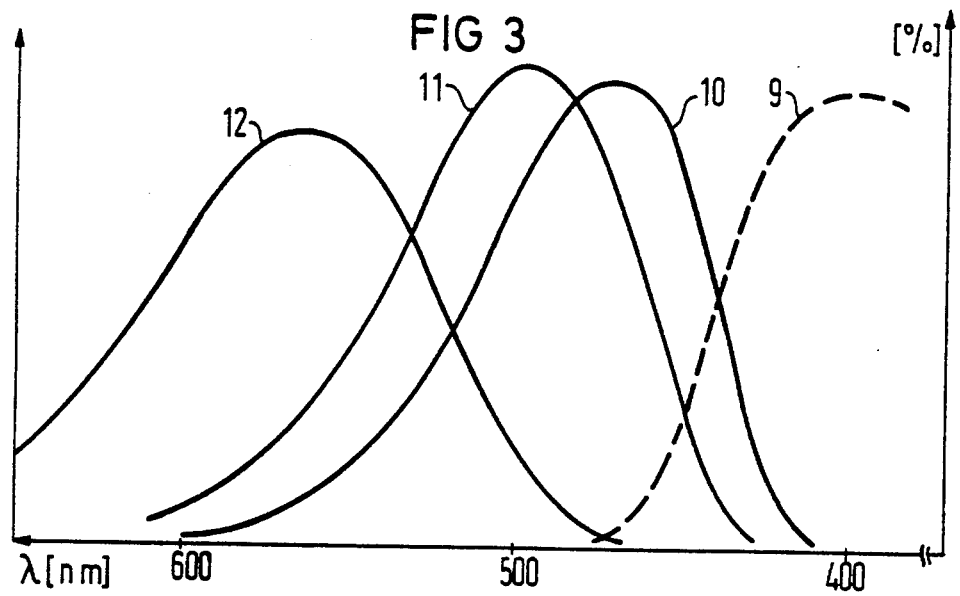
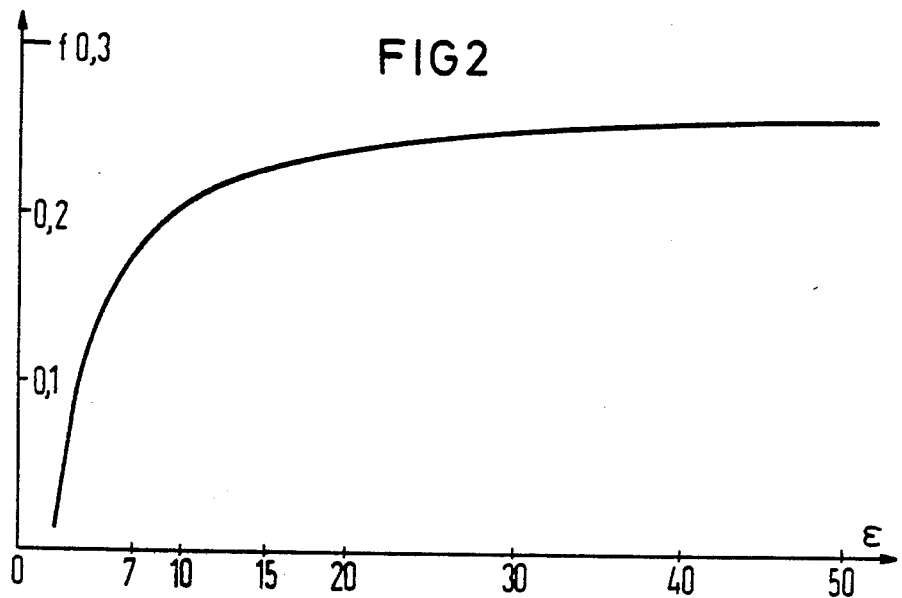

DEVICE FOR COLLECTING LIGHT AND METHOD OF MANUFACTURING SUCH DEVICE

BACKGROUND OF THE INVENTION

1. Field of the Invention

The invention relates to a device for concentrating radiant energy and somewhat more particularly to a device for collecting light and a method of producing such a device.

2. Prior Art

Devices for collecting light having, for example, a plate-shaped body (sometimes referred to as a "fluorescent" plate or body) functioning as a light trap having at least one light-exit window and comprised of a solid polymerized synthetic material having fluorescent particles therein are known in numerous embodiments and are useful, for example, for concentrating and collecting solar energy [P. B. Mauer and G. T. Turechek, Research Disclosure Vol. 129, paragraph 12930 (1975); German Offenlegungsschrift No. 26 20 115 (generally corresponding to U.S. Patent 4,110,123); or A. Goetzberger and W. Greubel, Applied Physics, Vol. 14, pages 123–139 (1977)], for optical indicia transmission (G. Baur et al, U.S. Ser. No. 932,569 filed Aug. 10, 1978), for image brightening of passive displays [German Offenlegungsschrift No. 25 54 226 (generally corresponding to U.S. Pat. No. 4,142,781) or W. Greubel and G. Baur, Elektronik Vol. 6, pages 55–56, (1977)], or for increasing the sensitivity of scintillators [G. Kell, Nuclear Instruments and Methods, Vol. 87, pages 111–123, (1970)].

In such devices, when light strikes a fluorescent plate, the light spectrum portion which is in the excitation spectrum of the fluorescent particles within the plate is absorbed by the fluorescent centers and the remaining portion of the light spectrum permeates the fluorescent plate without disturbance. The so-absorbed radiation, shifted toward longer wavelengths and spatially undirected, is re-emitted from the fluorescent centers. By far the greatest proportion of this fluorescent light is piped in the interior of the fluorescent plate via total reflections on the plate interfaces until it emerges at specific output areas with an increased intensity.

The efficiency achieved with presently available fluorescent plate still lags significantly behind theoretically possible values, primarily because the emission spectrum overlaps the absorption spectrum so that the fluorescent radiation in the plate has a finite absorption length. This "self-absorption" is particularly unsatisfactory with fluorescent bodies having a large collecting surface.

Workers in the field are aware that many organic fluorescent materials cause a shift of the emission spectrum toward lower frequencies, relative to the excited spectrum, when such materials are dissolved in a liquid having a strongly orientating polarization effect, i.e., a so-called red shift. Such red shift occurs when a fluorescing molecule has different dipole moments, $\mu_g$ in the basic or rest state and $\mu_a$ in the excited state, so that when $\mu_g$ is not equal to $\mu_a$ and when the polarization of the environment about such particle or molecule (which remains unchanged during the absorption process) can re-orientate during the existence of the excited state [see E. Lippert, Zeitschrift der Elektrochem. Ber. Bunsengesellschaft Phys. Chem., Vol. 61, pages 962–975, (1957)]. If $\mu_a$ is substantially greater than $\mu_g$, then one can readily observe a red shift of the emission spectrum, given an essentially unchanging position of the absorption spectrum. A blue shift of the absorption occurs, given an essentially unchanged position of the absorption spectrum when $\mu_g$ is substantially larger than $\mu_a$.

Fluorescent bodies are preferably comprised of a solid carrier material. Such solid carriers, particularly when they are synthetic organic materials, can be readily manufactured and processed with relatively low economic outlays, which is a very significant advantage, particularly in mass production.

That a desired spectrum band separation also depends on the dielectric constant ($\epsilon$) of a solvent in solid body solution and consequently the dipole difference in the basic and excited state plays an important role is suggested by the earlier cited Goetzberger and Greubel article in Applied Physics, Vol. 14, (1977), (cf. Section 3.3 therein). However, knowledge of how the suggested interrelationships might allow one to attain solid fluorescent bodies from a synthetic base materials with a high orientation polarization in actual practice is still absent. As a general rule, highly transparent synthetic materials which are presently available have only relatively small $\epsilon$-values, since up to now it was primarily a matter of achieving good electrical insulating properties.

SUMMARY OF THE INVENTION

In accordance with the principles of the invention, a device for collecting light is provided so as to comprise a body formed of a solid polymerized synthetic carrier material having fluorescent particles therein which exhibit finite dipole moments with different values in a basic and excited state of such particles and have a polar organic additive substantially uniformly distributed within the synthetic carrier material so as to create an environment with an orientation polarization about such fluorescent particles whereby the environment can re-orientate itself so quickly that it achieves its thermodynamic equilibrium substantially completely during the existence of the excited state in the fluorescent particles.

In certain preferred embodiments of the invention, the light-collecting body has a dielectric constant with $\epsilon$-values ranging between about 5 and 20 and preferably between about 7 and 15 at a frequency which approximately corresponds to the reciprocal life period of the excited state in the fluorescent particles. In certain preferred embodiments of the invention, the amount of additive distributed within a light-collecting body ranges from about 20 to 60 weight percent and preferably between about 30 to 50 weight percent, relative to the weight of the entire body. Such additives can be dissolved in or chemically linked with the synthetic carrier material. The carrier material can be a cross-linked (branch-chained) or a straight-chained material. The synthetic carrier materials useful in the practice of the invention are selected from the group consisting of a polyacrylate, a polymethacrylate, a polystyrene and a copolymer with a methacrylate and a styrene as main components. The additive is a relatively high-boiling polar organic material selected from the group consisting of a monomeric or polymeric alcohol, such as an aliphatic alcohol, (i.e., a glycol, for example an ethylene glycol, a di-, tri-, oligo- or polyethylene glycol, etc.), or an aromatic alcohol (i.e., benzyl alcohol), a nitrile (such as methacrylic acid-(2-nitrilopropyl) ester), an ionogenic or non-ionogenic soap, such as polyoxyethylene sorbitan monolaurate, a polar solvent, such as phthalic dibutyl ester and mixtures thereof.

In certain embodiments of the invention, the light-collecting device of the invention is manufactured or produced by admixing at least one select additive with a select initially monomeric synthetic carrier material and thereafter polymerizing such synthetic material and/or cross-linking such synthetic material. In certain other embodiments of the invention, the light-collecting device of the invention is produced by first polymerizing a select initially monomeric synthetic carrier material into a thermoplastic material, and thereafter admixing at least one select additive with the resultant thermoplastic synthetic carrier material to attain an additive-synthetic carrier material system and, optionally, cross-linking such system. In both of the foregoing embodiments, the admixed additive-synthetic carrier material system can be cast into a desired body form and, optionally, thereafter be cross-linked. Further, in both of the foregoing embodiments the synthetic material can be admixed with the additives at relatively high temperatures and thereafter the resultant admixture can be relatively quickly cooled to a lower temperature. In addition, in the embodiment wherein the synthetic material is first formed into a thermoplastic and admixed with the additives, the resultant additive-synthetic material system can be injection molded or extruded into a desired body form.

During the development of the invention, it was unexpectedly discovered that certain specific polar organic additives can be admixed or embedded in select synthetic materials which are known per se in such a manner that a substantially uniform solid phase is attained and such additives, nevertheless, retain their liquid characteristics in a certain manner and remain mobile. Fluorescent particles or molecules embedded in such a solid phase body are provided with an environment in which they can produce an orientation polarization with sufficient short relaxation periods. Such locally induced polarizations scatter light only slightly around a mean value so that, as a result, the absorption and emission bands are not spread to any extent and, consequently, not only are the two band maximums diplaced relative to one another but the overlapping of such bands noticeably decreases. The foregoing is valid in both instances when $\mu_a$ is substantially larger than $\mu_g$ and vice-versa.

Since the additive is substantially uniformly distributed within the carrier material and, thus, a location-independent orientation polarization ability prevails within a fluorescent body composed of such an additive-carrier material system, the device of the invention can also be essentially characterized or defined via the dielectric constant of the fluorescent body. The $\epsilon$-values of the fluorescent body must be sufficiently high, up to frequencies in the magnitude of the reciprocal life period of the excited state of a fluorescent particle. As indicated before, the fluorescent body of the invention has a dielectric constant with $\epsilon$-values ranging between about 5 and 20 at a frequency which approximately corresponds to the reciprocal life period of the excited state of the fluorescent particles.

In accordance with the principles of the invention, the choice of starting materials allows a multitude of polymer (synthetic carrier material/additive) combinations, which, as is confirmable by known experiments, meet all important requirements of a useful fluorescent body material. The most important of such requirements include the following: the starting material mixture (synthetic carrier material/additive) must be extremely transparent, without an expensive purification of such materials being required to achieve this property; the starting material mixture must be relatively thermally and photochemically stabile; the individual components of such starting material mixture must be compatible with one another; the starting material mixture must be readily formable into any desired body form and should be of sufficient hardness and form stability in its final state to provide a useful device. The additives cannot dissolve the initial synthetic carrier material (i.e., before polymerization and/or cross-linking) and must be good solvents for the fluorescent particles. Further, the additives should not negatively influence the quantum yield of the fluorescent materials and their chemical reactivity should be relatively minimal.

BRIEF DESCRIPTION OF THE DRAWINGS

FIG. 1 is a somewhat schematic elevational view of a light-collecting device produced and operating in accordance with the principles of the invention;

FIG. 2 is a graphical illustration showing the relationship between a measure of solvent polarity and the dielectric constant, $\epsilon$, for such solvent; and FIG. 3 is a graphical illustration of the absorption and emission spectrum of a fluorescent material, which for purposes of comparison, is dispersed in a fluorescent body of the invention, in a pure carrier material and in a pure additive.

DESCRIPTION OF THE PREFERRED EMBODIMENTS

The invention provides a device for collecting light and a method of producing such a device.

In accordance with the principles of the invention, a device for collecting light is comprised of a body, preferably a rectangular plate-shaped body (i.e., a "fluorescent body") functioning as a light trap and having at least one light exit window. Such a body is comprised of a solid polymerized synthetic carrier material having substantially uniformly dispersed therein fluorescent particles having finite dipole movements with different values in a basic or rest state and in an excited state, along with a polar organic additive which creates a environment with an orientation polarization around such fluorescent particles whereby the environment can re-orientate so quickly that it achieves its thermodynamic equilibrium substantially completely during the existence of the excited state in the fluorescent particles.

Such a light collecting device is illustrated at FIG. 1 and comprises a fluorescent plate 1 of a generally rectangular shape having a reflective layer 2 on three of its four narrow sides and having a solar cell 4 on its fourth narrow side, which is a light-exit window 3. A typical path of a sunbeam 5 lying in the excitation spectrum of the fluorescent particles is shown penetrating a major plane surface 1a of plate 1. As the beam 5 penetrates into the plate 1, it is absorbed by a fluorescent center 6 and is re-emitted and conducted or piped via total reflection through the body of plate 1 to the exit window 3 and onto the solar cell 4.

As discussed earlier, the dielectric constant, $\epsilon$, of the fluorescent body should have values as high as possible and at frequencies in the range of the reciprocal lifetimes of the excited fluorescent center (i.e., about $10^8$ Hz). Approximate $\epsilon$-values that produce a noticeable displacement effect can be determined approximately as follows.

For liquid solutions, Lippert derived the following equations on the basis of a simple model for the wave number difference, $\Delta Y_{O-O}$, of the O-O transitions in absorption and emission:

$$\Delta \gamma_{0-0} \sim \Delta f (\mu_a - \mu_g)^2 \quad (1)$$

with $$\Delta f = \frac{\epsilon - 1}{2\epsilon + 1} - \frac{n^2 - 1}{2n^2 + 1} \quad (2)$$

wherein $\epsilon$ is the dielectric constant, given a frequency having a magnitude of the reciprocal life period of the excited state of the fluorescent particles;

n is the index of refraction of a body, given a frequency in the visible range, $\mu_g$ is the dipole moment of the basic or rest state of the fluorescent particles, and $\mu_a$ is the dipole movement of the excited state of the fluorescent particles.

Equation (1) is valid given the assumption that, during the absorption process (approximately equal to $10^{-15}$ seconds), the electron polarization of the dipole moment change can occur practically inertia-free, while the orientation polarization of the environment remains unchanged, and that during the existence of the excited state (about $10^{-9}$ seconds), the environment can fully develop its thermodynamic equilibrium state. Equation (2) defines the difference of the dielectric reciprocal action energy of total polarization and displacement polarization, i.e., contains only the orientation polarization. Accordingly, $\Delta f$ is a measure of the polarity of the solvent.

If one plots the $\Delta f$-value with respect to the dielectric constant and bases it on a mean index of refraction, $n=1.5$, for visible light, then one observes that $\Delta f$ initially increases very rapidly with increased $\epsilon$-values and then slowly strives for an upper limiting value. Accordingly, the fluorescent band is already noticeably shifted, relative to the excited band, toward red when the $\epsilon$-value of a solvent is in the range of about 7 to 15.

The foregoing liquid-based results can be approximately translated to existing solid fluorescent bodies because in such bodies, at least in the immediate proximity of the individual fluorescent centers, comparable relationships are created. Experiments have shown that one can already suppress the interfering self-absorption with $\epsilon$-values of at least 5 in many instances. A graphical illustration of such results for solid fluorescent bodies is shown at FIG. 2 and, as can be derived therefrom, when the $\epsilon$-values of a solid fluorescent body is in the range of about 5 to 20 and more preferably in the range of about 7 to 15, a noticeable shift of the fluorescent band, relative to the excitation band, occurs.

However, such a high dielectric constant in a fluorescent body requires a sufficiently large amount of additive. In order to attain a reference point for the necessary additive concentration, the simpler relationships in liquid solutions is again first considered in the following discussion.

As a rough approximation, the $\epsilon$-value of a liquid mixture consisting of two components is $$\epsilon = (c-1)\epsilon_1 + c\epsilon_2 \quad (3)$$

wherein $\epsilon_1$ and $\epsilon_2$ are the dielectric constants of each of the two components in the liquid mixture; and c is the relative concentration of one of such components.

According to equation (3), $\epsilon$ rises linearly with the relative concentration of a polar additive. Equation (3) is, however, valid for fluorescent bodies composed of the inventive compositions only to a limited degree; the magnitude of the orientation polarization (which is the only concern in solid bodies), also depends on the viscosity of such bodies, as is known. And, since in the practice of the invention a highly viscous synthetic material is mixed with a relatively low viscosity polar additive, the resultant viscosity changes with the mixing ratio and $\epsilon$ must depend on the concentration c of the admixed polar additive in a more complicated fashion than set forth in equation (3). Thus, equation (3) only provides an initial indication of the required concentration range. On the bases of a series of experiments, it has been determined that the most favorable results are attained when the amount of polar additive ranges between about 20 to 60 wt. % and, more preferably, between 30 to 50 wt. %, on the basis of the total weight of the entire fluorescent body.

In order to further demonstrate the principles of the invention, an exemplary embodiment of a material combination of the invention was produced and compared against other material combinations. More specifically, a select fluorescent material (exemplary fluorescent materials are disclosed in U.S. Ser. No. 932,569 now U.S. Patent No. 4,222,880, filed Aug. 10, 1978, which is incorporated herein by reference), was dissolved in polymethylacrylate (PMMA), a carrier material, alone; in triethylene glycol, a polar organic additive, alone and in a mixture suitable for forming the light-collecting device of the invention and consisting of PMMA and 17 wt. % of triethylene glycol. Since each of the foregoing materials contained the same fluorescent material, the absorption spectrum of each was identical and is illustrated at FIG. 3 by broken-line curve 9. The emission spectrum of the three materials was measured and is graphically reproduced by the solid line curves at FIG. 3. Curve 10 illustrates the emission spectrum of the PMMA solution, curve 11 illustrates the emission spectrum of the PMMA/glycol solution and curve 12 shows the emission spectrum of the glycol solution. As can be seen from a comparison of these curves, the emission spectrum is shifted toward greater wavelengths with increasing polarity, from the blue-green fluorescence in PMMA, to the green fluorescence in the PMMA/glycol mixture, and up to the yellow fluorescence in the polar liquid additive alone.

Of course, the invention is not limited to the material combinations set forth in the exemplary embodiment and other combinations are useful.

The synthetic carrier material can be selected from the group consisting of polyacrylates, polymethacrylates, polystyrene, copolymers of methacrylate and styrene and other like synthetic carrier materials, which can be branched or straight-chained and can exist in a monomeric or thermoplastic form and which are already polymerizable into a solid polymerized body.

Similarly, the polar organic additives can be selected from the group consisting of relatively high boiling alcohols, nitriles, ionogenic or non-ionogenic soaps, polar solvents and mixtures thereof. Useful alcohols include aliphatic and aromatic alcohols. Among the aliphatic alcohols, glycols, such as ethylene glycol ($\epsilon = 37.7$; boiling at approximately 197° C.), bi-, tri-, oligo- and/or polyethylene glycols are preferred. A useful exemplary aromatic alcohol is benzyl alcohol ($\epsilon = 13.1$; boiling at approximately 205° C.). A useful example of a chemically bonded alcohol is methacrylic acid-(2-hydroxypropyl) ester. A useful exemplary nitrile is methacrylic acid-(2-nitrilopropyl) ester, while a useful example of the soaps is polyoxyethylene sorbitan monolaurate and a useful example of a high boiling polar solvent is phthalic dibutyl ester. Other polar organic additives which are compatible with the synthetic carrier material at relatively high concentrations may also be used.

The fluorescent body of a light collecting device of the invention can be produced via various methods. Most advantageously, an injection molding process or an extrusion process is utilized to produce a desired body form, however, a select body form can also be cast from a suitable material mixture. In such processes, a select polar additive can either be mixed with an un-cross-linked (thermoplastic) polymer, for example, in an extruder or the select additive can be mixed with monomers capable of forming a desired carrier material and then subjected to polymerization conditions. In instances where a casting process is utilized, the initial material for the carrier (polymer) does not have to be a thermoplastic and, as in the case of common casting resins, such material can be cross-linked during polymerization.

There are some carrier material/additive combinations which mix well at relatively high temperatures but tend to partially crystallize out in one or both components during a slow cooling-off. This problem can be alleviated by quickly bringing the mixture from the relatively high temperature to a relatively low temperature so that an amorphous glass state is attained. Such a quenching process, for example, is accomplished automatically by forming a desired body in an injection molding machine where the form is usually maintained at a temperature around approximately 60° C.

The final products manufactured by the process of the invention can be either thermoplastic synthetics with polar additives in dissolved or chemically bonded form, or, cross-linked thermoplastic synthetics with polar organic additives which are likewise dissolved or chemically bonded.

The invention is not limited to the exemplary embodiments described in detail herein. In particular, the fluorescent body can be in a form other than strictly plate-shaped as long as the light trap effect on the basis of total and internal reflection is retained. Suitable body embodiments, for example, are disclosed in co-pending U.S. Ser. No. 909,553 filed May 25, 1978, which is incorporated herein by reference.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention

1. A device for collecting light comprised of a body functioning as a light trap and having at least one light exit window, said body being comprised of a solid polymerized synthetic carrier material having substantially uniformly dispersed fluorescent particles which have finite dipole moments with different values in the basic state and the excited state and an amount of at least one polar organic additive which creates an environment with an orientation polarization around the fluorescent particles whereby said environment can re-orient so quickly that it achieves its thermodynamic equilibrium substantially completely during the existence of the excited state in the fluorescent particles.

2. A device as defined in claim 1 wherein said body is substantially plate-shaped.

3. A device as defined in claim 1 wherein said body has a dielectric constant with $\epsilon$-value ranging between about 5 and 20 at a frequency which approximately corresponds to the reciprocal life period of the excited state in the fluorescent particles.

4. A device as defined in claim 3 wherein the body has a dielectric constant with $\epsilon$-value ranging between about 7 and 15 at a frequency which approximately corresponds to the reciprocal life period of the excited state in the fluorescent particles.

5. A device as defined in claim 1 wherein the amount of additive in the synthetic carrier material ranges between about 20 and 60 weight % on the basis of the total weight of the entire body.

6. A device as defined in claim 1 wherein the amount of additive in said synthetic carrier material ranges between about 30 and 50 weight % on the basis of the weight of the entire body.

7. A device as defined in claim 1 wherein said additive is dissolved in said synthetic carrier material.

8. A device as defined in claim 1 wherein said additive is chemically bonded in said synthetic carrier material.

9. A device as defined in claim 1 wherein said synthetic carrier material is cross-linked.

10. A device as defined in claim 1 wherein said synthetic carrier material is uncross-linked.

11. A device as defined in claim 1 wherein said synthetic carrier material is a polyacrylate.

12. A device as defined in claim 1 wherein said synthetic carrier material is a polymethacrylate.

13. A device as defined in claim 1 wherein said synthetic carrier material is a polystyrol.

14. A device as defined in claim 1 wherein said synthetic carrier material is a copolymer with a methacrylate and a styrene as main components.

15. A device as defined in claim 1 wherein said synthetic carrier material is selected from the group consisting of a polyacrylate, a polymethacrylate, a polystyrene and a copolymer with a methacrylate and a styrene as main components.

16. A device as defined in claim 1 wherein said additive is comprised of a alcohol.

17. A device as defined in claim 16 wherein said alcohol is a monomeric alcohol.

18. A device as defined in claim 16 wherein said alcohol is a polymeric alcohol.

19. A device as defined in claim 16 wherein said alcohol is an aliphatic alcohol.

20. A device as defined in claim 19 wherein said aliphatic alcohol is a glycol.

21. A device as defined in claim 20 wherein said glycol is selected from the group consisting of an ethylene glycol, a di-ethylene glycol, a tri-ethylene glycol, an oligo-ethylene glycol and a polyethylene glycol.

22. A device as defined in claim 16 wherein said alcohol is an aromatic alcohol.

23. A device as defined in claim 22 wherein said aromatic alcohol is benzyl alcohol.

24. A device as defined in claim 1 wherein said additive is a nitrile.

25. A device as defined in claim 24 wherein said nitrile is methacrylic acid-(2-nitrilopropyl) ester.

26. A device as defined in claim 1 wherein said additive is an ionogenic soap.

27. A device as defined in claim 1 wherein said additive an non-ionogenic soap.

28. A device as defined in claim 27 wherein said non-ionogenic soap is a polyoxyethylene sorbitan monolaurate.

29. A device as defined in claim 1 wherein said additive is a relatively high-boiling polar solvent.

30. A device as defined in claim 29 wherein said polar solvent is phthalic dibutyl ester.

31. A device as defined in claim 1 wherein said additive is selected from the group consisting of relatively high boiling alcohols, nitriles, soaps, polar solvents and mixtures thereof.

32. The device of claim 1 manufactured by a process wherein said additive is mixed with an initially monomeric form of said synthetic carrier material and then said monomeric form of said synthetic carrier material is polymerized.

33. The device as defined in claim 32 wherein the admixed synthetic carrier material/additive system is cast in the form of a desired body and is thereafter cross-linked.

34. The device as defined in claim 32 wherein said mixing of additive and initial monomeric form of the synthetic carrier material occurs at a relatively high temperature and the so-attained mixture is relatively quickly brought to a low temperature.

35. The device as defined in claim 1 wherein said additive is mixed with an initially monomeric form of said synthetic carrier material and then said monomeric form of said synthetic carrier material is cross-linked.

36. The device defined in claim 1 wherein an initially monomeric form of said synthetic carrier material is polymerized into a thermoplastic state and then said additive is admixed with the thermoplastic synthetic carrier material.

37. The device as defined in claim 36 wherein said synthetic carrier material is admixed with said additive at a relatively high temperature and the so-attained mixture is relatively quickly brought to a low temperature.

38. The device as defined in claim 36 wherein the admixed thermoplastic synthetic carrier material/additive system is cross-linked.

39. The device as defined in claim 38 wherein said thermoplastic synthetic carrier material is admixed with said additive at a relatively high temperature and the resultant mixture is relatively quickly brought to a low temperature.

40. The device as defined in claim 36 wherein said thermoplastic carrier material/additive system is formed into a desired body via injection molding.

41. The device as defined in claim 40 wherein said additive is admixed with said thermoplastic synthetic carrier material at a relatively high temperature and the so-attained mixture is relatively quickly brought to relatively low temperature.

42. The device as defined in claim 36 wherein said thermoplastic synthetic carrier material/additive system is formed into a desired body form via extrusion.

43. The device as defined in claim 42 wherein said synthetic carrier material is admixed with the additive at relatively high temperature and the so-attained mixture is relatively quickly brought to low temperatures.

* * * * *